US009164643B2

(12) United States Patent
Huang et al.

(10) Patent No.: US 9,164,643 B2
(45) Date of Patent: Oct. 20, 2015

(54) METHOD FOR CONTROLLING OPERATIONS OF INPUT DEVICE HAVING RESISTOR MATRIX

(71) Applicant: UNIVERSAL CEMENT CORPORATION, Taipei (TW)

(72) Inventors: Chih-Hung Huang, Taipei (TW); Chih-Sheng Hou, Taipei (TW)

(73) Assignee: UNIVERSAL CEMENT CORPORATION, Taipei (TW)

( * ) Notice: Subject to any disclaimer, the term of this patent is extended or adjusted under 35 U.S.C. 154(b) by 69 days.

(21) Appl. No.: 14/147,568

(22) Filed: Jan. 5, 2014

(65) Prior Publication Data
US 2014/0191795 A1 Jul. 10, 2014

Related U.S. Application Data

(60) Provisional application No. 61/749,925, filed on Jan. 8, 2013.

(51) Int. Cl.
G01L 1/22 (2006.01)
G06F 3/045 (2006.01)
H03K 17/96 (2006.01)

(52) U.S. Cl.
CPC ............ G06F 3/045 (2013.01); H03K 17/9625 (2013.01)

(58) Field of Classification Search
CPC .................................................. H03K 17/9625
USPC ........................ 73/862.044, 862.041–862.046
See application file for complete search history.

(56) References Cited

U.S. PATENT DOCUMENTS

| 6,225,986 | B1 * | 5/2001 | Sato et al. | 345/178 |
| 7,505,347 | B2 * | 3/2009 | Rinerson et al. | 365/209 |
| 7,554,531 | B2 * | 6/2009 | Baker et al. | 345/173 |
| 7,873,119 | B2 * | 1/2011 | Chan et al. | 375/297 |
| 8,648,610 | B2 * | 2/2014 | Mikami et al. | 324/555 |

* cited by examiner

Primary Examiner — Max Noori
(74) Attorney, Agent, or Firm — Winston Hsu; Scott Margo

(57) ABSTRACT

A method for controlling an input device is provided. The input device has a resistor matrix having M first traces, N second traces and M×N resistors. Each second trace is coupled to a reference resistor and M−1 variable resistors. M and N are integers greater than 1. A first voltage level of each second trace is measured when a first voltage is applied to a first end of the reference resistor and a second voltage is applied to first ends of the M−1 variable resistors via the M first traces. Variations of the first voltage level of each second trace are measured, such that it could be determined whether any touch point of the input device exists according to the variations of the first voltage level of each second trace.

28 Claims, 14 Drawing Sheets

METHOD FOR CONTROLLING OPERATIONS OF INPUT DEVICE HAVING RESISTOR MATRIX

CROSS REFERENCE TO RELATED APPLICATIONS

This application claims the benefit of U.S. Provisional Application No. 61/749,925, filed on Jan. 8, 2013 and entitled "Method of Scanning Array Resistor", the contents of which are incorporated herein in their entirety.

BACKGROUND OF THE INVENTION

1. Field of the Invention

The present invention is related to a method for controlling operations of an input device, and more particularly to a method for controlling operations of an input device having a resistor matrix.

2. Description of the Prior Art

Please refer to FIG. 1, which is a schematic diagram of an input device 100 according to the prior art. The input device 100 has a power control circuit 110 and a switch matrix 120. The power control circuit 110 sequentially supplies voltages $V_1, V_2, V_3$ and $V_4$ to the switch matrix 120. The switch matrix 120 has a plurality of first traces 121, a plurality of second traces 122 and a plurality of switches $P_{11}$ to $P_{44}$. A first end of each of the switches $P_{11}$ to $P_{44}$ is coupled to one of the first traces 121, and a second end of each of the switches $P_{11}$ to $P_{44}$ is coupled to one of the second traces 122. Each of the second traces 122 is coupled to one of output terminals $O_1$ to $O_4$ of the input device 100.

When a user touches the input device 100, a switch located at the touch point is turned on. For example, when the user touches an area around the switch $P_{11}$, the switch $P_{11}$ is turned on. Since the switch $P_{11}$ is turned on, when the power control circuit 110 supplies the voltage $V_1$ to the switch matrix 120, a current flows from the power control circuit 110 through the switch $P_{11}$ to the output terminal $O_1$. Therefore, the location of the touch point of the input device 100 could be determined according to detected currents outputted from the output terminals $O_1$ to $O_4$ and the timing of sequentially applying the voltages $V_1, V_2, V_3$ and $V_4$ to the first traces 121.

However, when two or more touch points of the input device 100 are triggered at the same time, the input device 100 may miscalculate the locations of the touch points. For example, when the user touches an area around the switches $P_{21}, P_{12}$ and $P_{22}$, the switches $P_{21}, P_{12}$ and $P_{22}$ are turned on accordingly. Since the switches $P_{21}, P_{12}$ and $P_{22}$ are turned on, when the power control circuit 110 supplies the voltage $V_1$ to the switch matrix 120, a current I flows from the power control circuit 110 through the switch $P_{21}, P_{22}$ and $P_{12}$ sequentially to the output terminal $O_1$. Accordingly, the input device 100 miscalculates that the touch point is located on the position of the switch $P_{11}$.

SUMMARY OF THE INVENTION

A method for controlling operations of an input device is disclosed. The input device comprises a resistor matrix having M first traces, N second traces and M×N resistors. First ends of resistors of a same column are connected to one of the M first traces, second ends of resistors of a same row are connected to one of the N second traces, and each second trace are coupled to a reference resistor and M−1 variable resistors. M and N are integers greater than 1. The method comprises measuring a first voltage level of the each second trace when a first voltage is applied to a first end of the reference resistor and a second voltage is applied to first ends of the M−1 variable resistors via the M first traces; measuring variations of the first voltage level of the each second trace; and determining at least one touch point of the input device according to the variations of the first voltage level of the each second trace.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
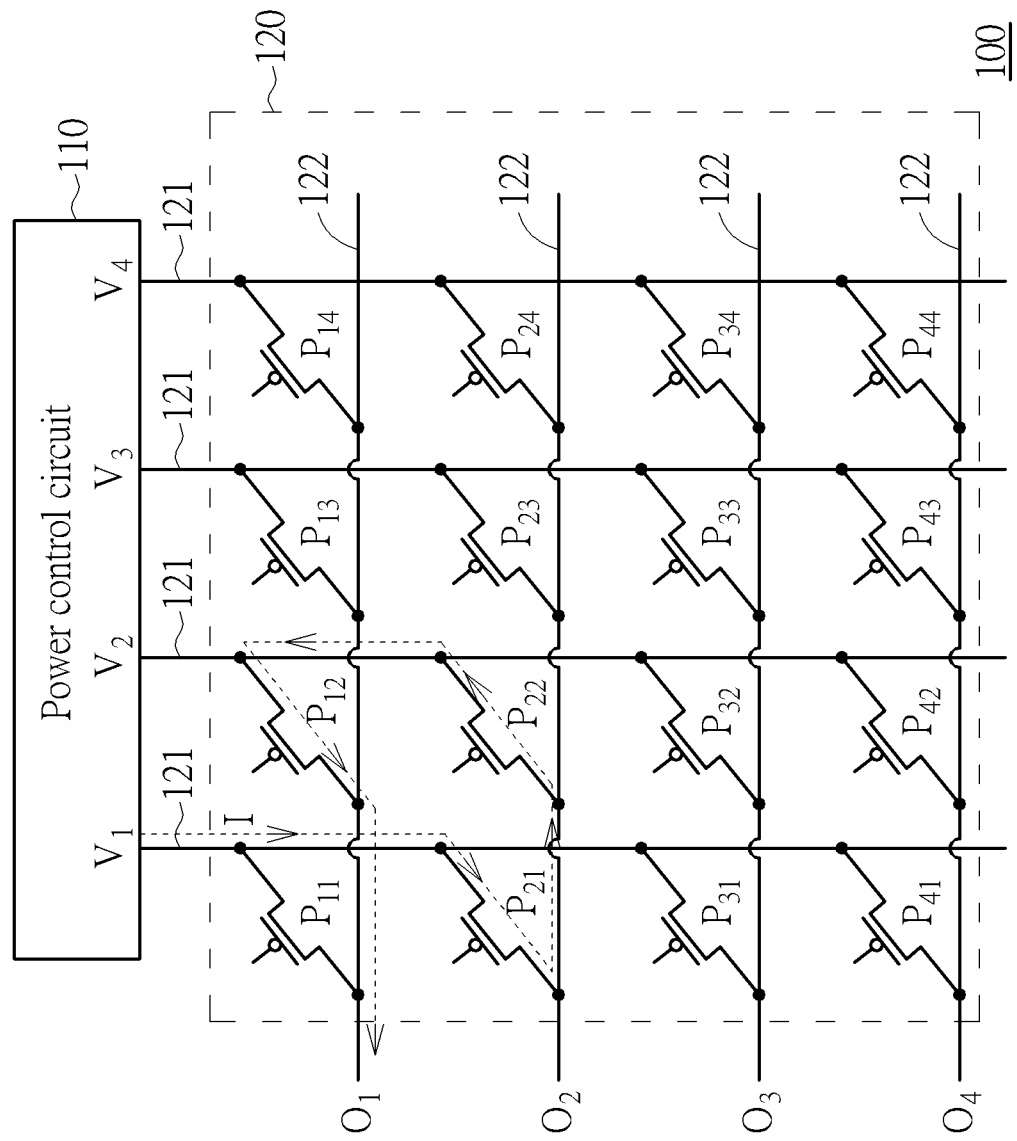
FIG. 1 is a schematic diagram of an input device according to the prior art.
Figure 2:
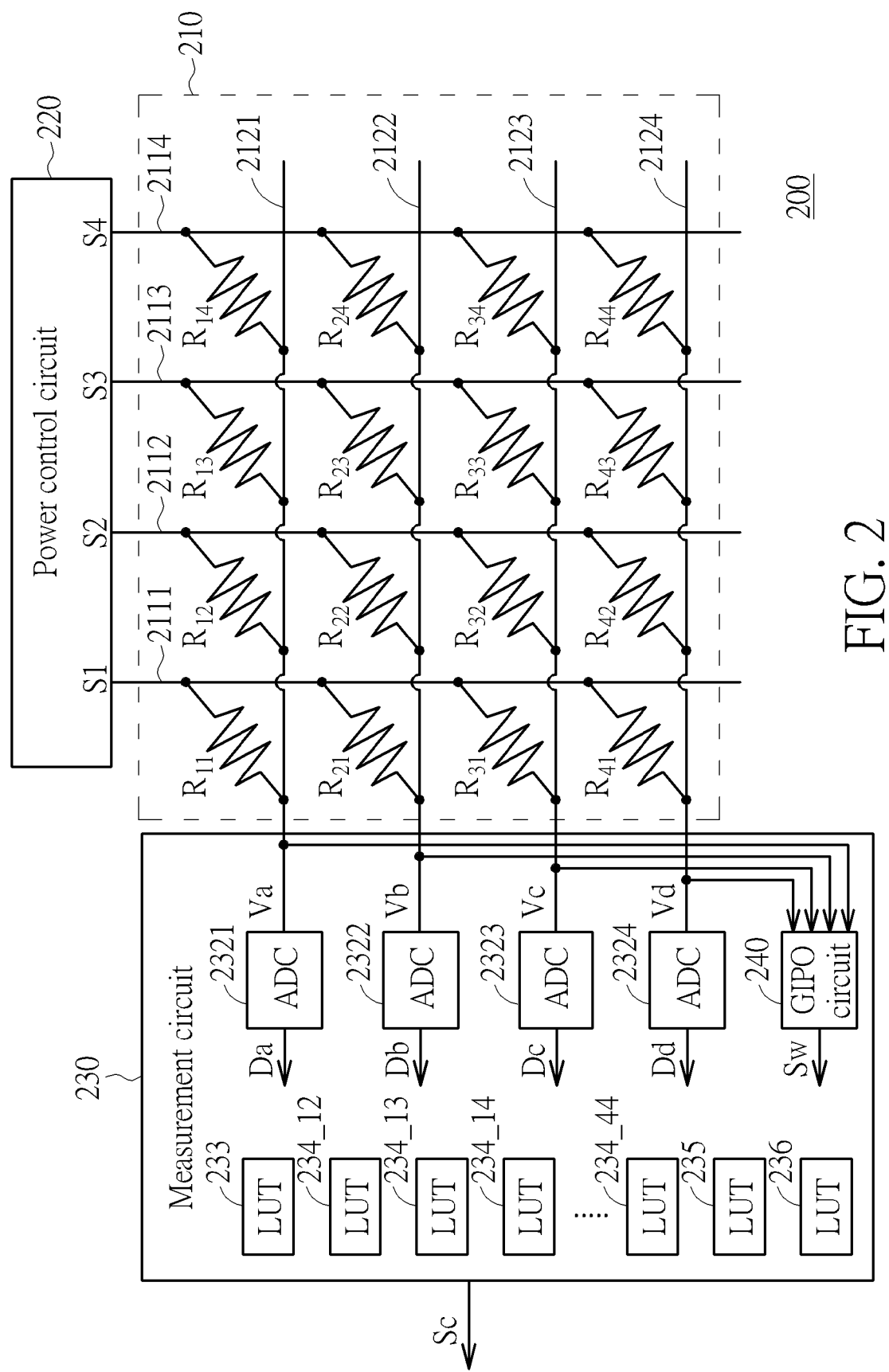
FIG. 2 is a schematic diagram of an input device according to an embodiment of the present invention.

Please refer to FIG. 2, which is a schematic diagram of an input device 200 according to an embodiment of the present invention. The input device 200 has a resistor matrix 210, a power control circuit 220 and a measurement circuit 230. The resistor matrix 210 has M first traces 2111 to 2114, N second traces 2121 to 2124, and M×N resistors $R_{11}$ to $R_{44}$. In the embodiment, both of M and N are equal to 4. However, the present invention is not limited thereto. M and N could be any integer greater than 1.

Regarding the resistors $R_{11}$ to $R_{44}$, the first ends of resistors of a same column are connected to one of the M first traces 2111 to 2114. For example, the first ends of resistors $R_{11}, R_{21}, R_{31}$ and $R_{41}$ of a first column of the resistor matrix 210 are connected to the first trace 2111; the first ends of resistors $R_{12}$, $R_{22}$, $R_{32}$ and $R_{42}$ of a second column of the resistor matrix 210 are connected to the first trace 2112; the first ends of resistors $R_{13}$, $R_{23}$, $R_{33}$ and $R_{43}$ of a third column of the resistor matrix 210 are connected to the first trace 2113; and the first ends of resistors $R_{14}$, $R_{24}$, $R_{34}$ and $R_{44}$ of a fourth column of the resistor matrix 210 are connected to the first trace 2114.

Moreover, regarding the resistors $R_{11}$ to $R_{44}$, the second ends of resistors of a same row are connected to one of the N second traces 2121 to 2124. For example, the second ends of resistors $R_{11}$, $R_{12}$, $R_{13}$ and $R_{14}$ of a first row of the resistor matrix 210 are connected to the second trace 2121; the second ends of resistors $R_{21}$, $R_{22}$, $R_{23}$ and $R_{24}$ of a second row of the resistor matrix 210 are connected to the second trace 2122; the second ends of resistors $R_{31}$, $R_{32}$, $R_{33}$ and $R_{34}$ of a third row of the resistor matrix 210 are connected to the second trace 2123; and the second ends of resistors $R_{41}$, $R_{42}$, $R_{43}$ and $R_{44}$ of a fourth row of the resistor matrix 210 are connected to the second trace 2124.

Additionally, each of the second traces 2121 to 2124 is coupled to a reference resistor and M−1 variable resistors. For example, in the embodiment, the resistors $R_{11}$, $R_{21}$, $R_{31}$ and $R_{41}$ are reference resistors and have constant resistances, and the resistors $R_{12}$ to $R_{14}$, $R_{22}$ to $R_{24}$, $R_{32}$ to $R_{34}$ and $R_{42}$ to $R_{44}$ are variable resistors. The second trace 2121 is coupled to the reference resistor $R_{11}$ and the variable resistors $R_{12}$ to $R_{14}$. The second trace 2122 is coupled to the reference resistor $R_{21}$ and the variable resistors $R_{22}$ to $R_{24}$. The second trace 2123 is coupled to the reference resistor $R_{31}$ and the variable resistors $R_{32}$ to $R_{34}$. The second trace 2124 is coupled to the reference resistor $R_{41}$ and the variable resistors $R_{42}$ to $R_{44}$.

In an embodiment of the present invention, for the sake of accuracy of measurement, a ratio of resistance of the reference resistors to resistance of each of the variable resistors under activation force in each row of the resistor matrix 210 may fall in a range of 0.2 to 5. The strength of the activation force is greater than or equal to a predetermined threshold (e.g. 20 grams). When the activation force is applied to one of the variable resistors, a touch point around the variable resistor, which is applied with the activation force, is determined to being triggered. In this document, the resistance of the variable resistor under the activation force is termed "activation force resistance". In other words, the ratio of the resistance of the reference resistors $R_{11}$ to the activation force resistance of each of the variable resistors $R_{12}$ to $R_{14}$ in the first row of the resistor matrix 210 falls in the range of 0.2 to 5. The ratio of the resistance of the reference resistors $R_{21}$ to the activation force resistance of each of the variable resistors $R_{22}$ to $R_{24}$ in the second row of the resistor matrix 210 falls in the range of 0.2 to 5. The ratio of the resistance of the reference resistors $R_{31}$ to the activation force resistance of each of the variable resistors $R_{32}$ to $R_{34}$ in the third row of the resistor matrix 210 falls in the range of 0.2 to 5, and the ratio of the resistance of the reference resistors $R_{41}$ to the activation force resistance of each of the variable resistors $R_{42}$ to $R_{44}$ in the fourth row of the resistor matrix 210 falls in the range of 0.2 to 5.

Figure 3:
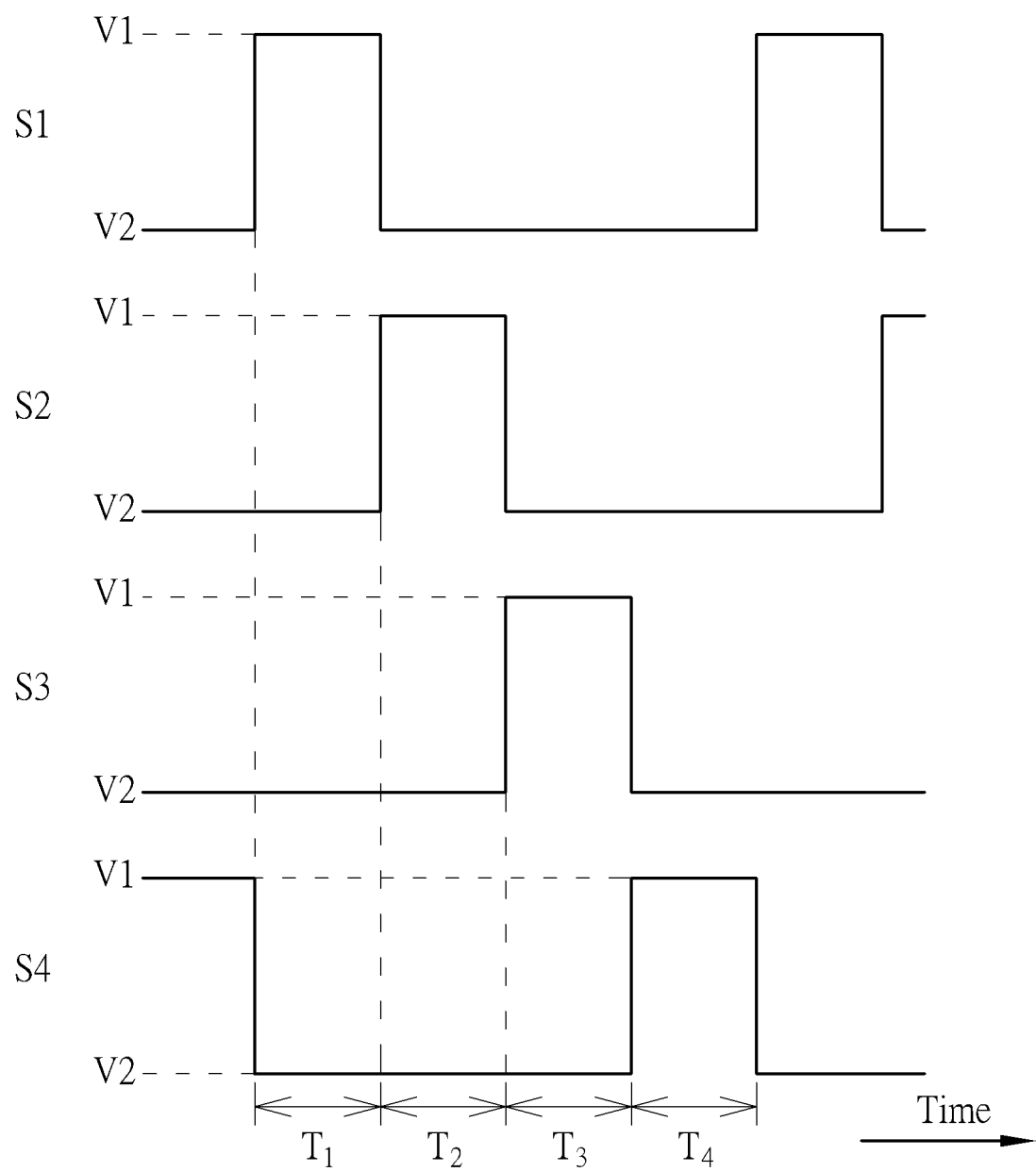
FIG. 3 is a timing diagram of voltage signals of the input device in FIG. 2.

The power control circuit 220 is coupled to the first traces 2111 to 2114 and is configured to supply voltage signals S1 to S4 to the first traces 2111 to 2114. Please refer to FIGS. 2 and 3. FIG. 3 is a timing diagram of the voltage signals S1 to S4. The voltage signals S1 to S4 are respectively transmitted to the first traces 2111, 2112, 2113 and 2114 by the power control circuit 220. During a period $T_1$, a voltage level of the voltage signal S1 is equal to a first voltage V1, and voltage levels of the remaining voltage signals S2 to S4 are equal to a second voltage V2. In the embodiment, the first voltage V1 is greater than the second voltage V2, and the second voltage V2 could be a positive voltage, a ground voltage (i.e. 0 volt) or a negative voltage. In another embodiment, the first voltage V1 could be less than the second voltage V2, and the first voltage V1 could be a positive voltage, the ground voltage (i.e. 0 volt) or a negative voltage. Similarly, during a period $T_2$, the voltage level of the voltage signal S2 is equal to the first voltage V1, and the voltage levels of the remaining voltage signals S1, S3 and S4 are equal to the second voltage V2. During a period $T_3$, the voltage level of the voltage signal S3 is equal to the first voltage V1, and the voltage levels of the remaining voltage signals S1, S2 and S4 are equal to the second voltage V2. During a period $T_4$, the voltage level of the voltage signal S4 is equal to the first voltage V1, and the voltage levels of the remaining voltage signals S1 to S3 are equal to the second voltage V2. In other words, the power control circuit 220 applies the first voltage V1 to the first traces 2111 to 2114 in a predetermined sequence. In the embodiment, the predetermined sequence is 2111→2112→2113→2114. However, the present invention is not limited thereto. For example, the predetermined sequence also could be 2112→2111→2114→2113, or other sequences. When the first voltage V1 is applied to one of the first traces 2111 to 2114, the voltage control circuit 220 applies the second voltage V2 to the remaining first traces which are not applied with the first voltage V1.

The measurement circuit 230 is coupled to the second trances 2121 to 2124 and is configured to measure variations of voltage levels Va, Vb, Vc and Vd of the second traces 2121 to 2124 when the power control circuit 220 applies the first voltage V1 and the second voltage V2 to the first traces 2111 to 2114. Moreover, the measurement circuit 230 outputs a control signal Sc according to the measured voltage levels Va, Vb, Vc and Vd of the second traces 2121 to 2124. In an embodiment of the present invention, the measurement circuit 230 comprises a plurality of analog to digital converters (ADCs) 2321 to 2324. Each of the ADCs 2321 to 2324 is coupled to one of the second traces 2121 to 2124 and is configured to convert the voltage level Va, Vb, Vc or Vd into a digital value Da, Db, Dc or Dd. In an embodiment of the present invention, the measurement circuit 230 could generate and output the control signal Sc according to the digital values Da to Dd.

Figure 4:
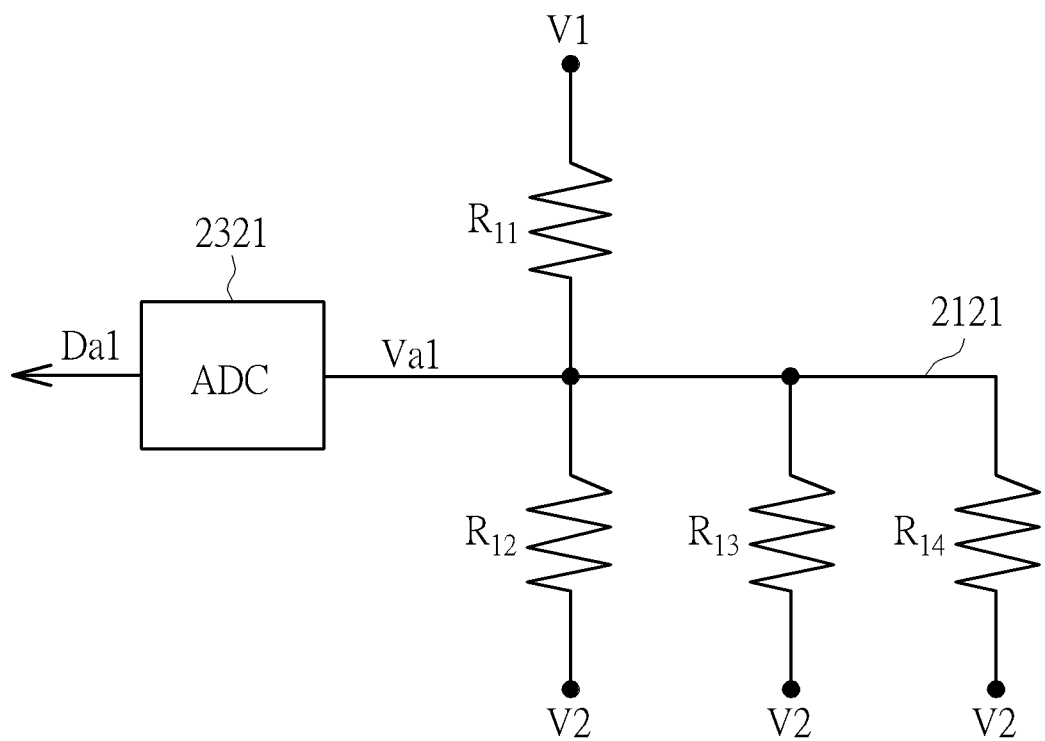
FIG. 4 is an equivalent circuit diagram of resistors of a first row of the resistor matrix in FIG. 2.

Please refer to FIGS. 2 and 4. FIG. 4 is an equivalent circuit diagram of resistors $R_{11}$, $R_{12}$, $R_{13}$ and $R_{14}$ of the first row of the resistor matrix 210 during the period $T_1$. During the period $T_1$, the voltage level of the voltage signal S1 is the first voltage V1, and the voltage levels of the remaining voltage signals S2 to S4 are the second voltage V2. Since the first ends of the resistors $R_{12}$, $R_{13}$ and $R_{14}$ are applied with the second voltage V2, and the second ends of the resistors $R_{12}$, $R_{13}$ and $R_{14}$ are coupled to the second trace 2121, the resistors $R_{12}$, $R_{13}$ and $R_{14}$ are connected in parallel and connected to the resistor $R_{11}$ in series during the period $T_1$. Therefore, the equivalent resistance of the resistors $R_{11}$, $R_{12}$, $R_{13}$ and $R_{14}$ during the period $T_1$ could be represented as follows:

$$R_{11} = \frac{R_{12}R_{13}R_{14}}{R_{12}R_{13} + R_{13}R_{14} + R_{12}R_{14}}$$

If the voltage level Va during the period $T_1$ is represented as Va1, the voltage level Va1 could be represented as follows according to the principle of voltage division:

$$Va1 = \frac{\frac{R_{12}R_{13}R_{14}}{R_{12}R_{13}+R_{13}R_{14}+R_{12}R_{14}}}{R_{11}+\frac{R_{12}R_{13}R_{14}}{R_{12}R_{13}+R_{13}R_{14}+R_{12}R_{14}}}(V1-V2)+V2 \qquad (1)$$

$$= \frac{R_{12}R_{13}R_{14}}{R_{11}R_{12}R_{13}+R_{11}R_{13}R_{14}+R_{11}R_{12}R_{14}+R_{12}R_{13}R_{14}}(V1-V2)+V2$$

Figure 5:
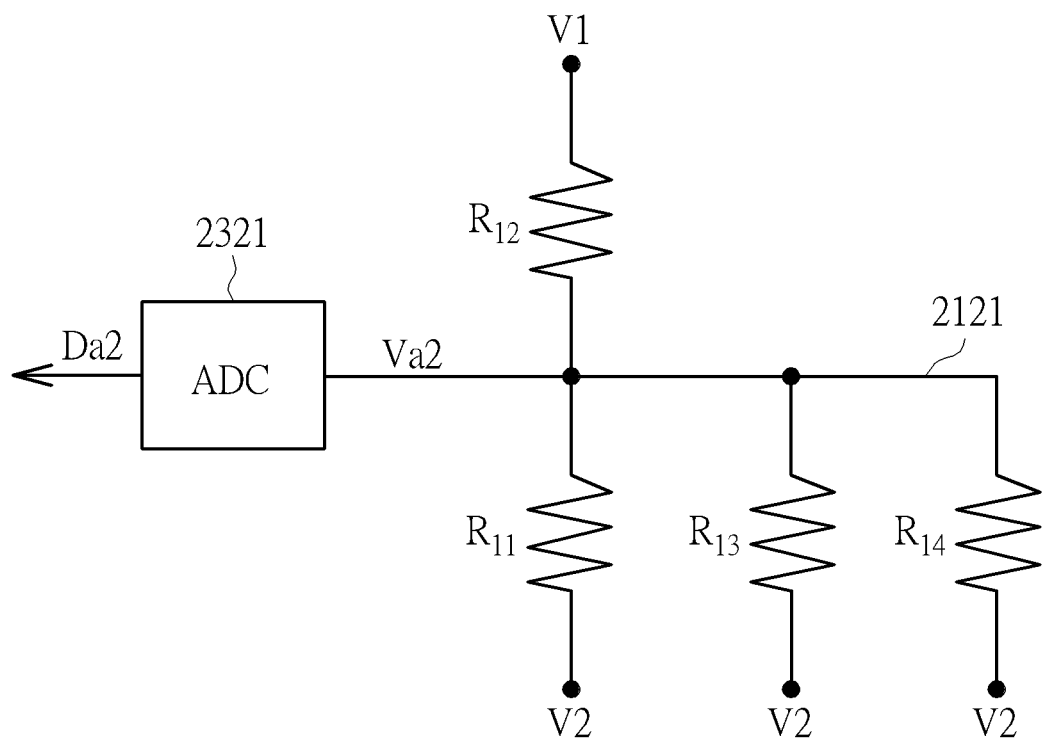
FIG. 5 is another equivalent circuit diagram of resistors of the first row of the resistor matrix in FIG. 2.

Please refer to FIGS. 2 and 5. FIG. 5 is an equivalent circuit diagram of the resistors $R_{11}$, $R_{12}$, $R_{13}$ and $R_{14}$ of the first row of the resistor matrix 210 during the period $T_2$. During the period $T_2$, the voltage level of the voltage signal S2 is the first voltage V1, and the voltage levels of the remaining voltage signals S1, S3 and S4 are the second voltage V2. Since the first ends of the resistors $R_{11}$, $R_{13}$ and $R_{14}$ are applied with the second voltage V2, and the second ends of the resistors $R_{11}$, $R_{13}$ and $R_{14}$ are coupled to the second trace 2121, the resistors $R_{11}$, $R_{13}$ and $R_{14}$ are connected in parallel and connected to the resistor $R_{12}$ in series during the period $T_2$. Therefore, the equivalent resistance of the resistors $R_{11}$, $R_{12}$, $R_{13}$ and $R_{14}$ during the period $T_2$ could be represented as follows:

$$R_{12}+\frac{R_{11}R_{13}R_{14}}{R_{11}R_{13}+R_{13}R_{14}+R_{11}R_{14}}$$

If the voltage level Va during the period $T_2$ is represented as Va2, the voltage level Va2 could be represented as follows according to the principle of voltage division:

$$Va2 = \frac{\frac{R_{11}R_{13}R_{14}}{R_{11}R_{13}+R_{13}R_{14}+R_{11}R_{14}}}{R_{12}+\frac{R_{11}R_{13}R_{14}}{R_{11}R_{13}+R_{13}R_{14}+R_{11}R_{14}}}(V1-V2)+V2 \qquad (2)$$

$$= \frac{R_{11}R_{13}R_{14}}{R_{11}R_{12}R_{13}+R_{12}R_{13}R_{14}+R_{11}R_{12}R_{14}+R_{11}R_{13}R_{14}}(V1-V2)+V2$$

According to the equations (1) and (2), if the second voltage V2 is 0 volt, then:

$$\frac{Va1}{Va2} = \frac{R_{12}}{R_{11}} \qquad (3)$$

Moreover, since the ADC 2321 converts the voltage level Va1 into a digital value Da1 and converts the voltage level Va2 into a digital value Da2, the equation (3) could be also represented as follows:

$$\frac{Da1}{Da2} = \frac{Va1}{Va2} = \frac{R_{12}}{R_{11}} \qquad (4)$$

Based on the equation (3) or (4), a ratio of the voltage level Va1 to the voltage level Va2 is equal to a ratio of the resistance of the resistor $R_{12}$ to the resistance of the resistor $R_{11}$. Similarly, if the voltage level Va during the period $T_3$ and $T_4$ is represented as Va3 and Va4 respectively, and the second voltage V2 is 0 volt, then:

$$\frac{Va1}{Va3} = \frac{R_{13}}{R_{11}}$$

$$\frac{Va1}{Va4} = \frac{R_{14}}{R_{11}}$$

$$\frac{Va2}{Va3} = \frac{R_{13}}{R_{12}}$$

$$\frac{Va2}{Va4} = \frac{R_{14}}{R_{12}}$$

$$\frac{Va3}{Va4} = \frac{R_{14}}{R_{13}}$$

Therefore, the measurement circuit 230 may obtain the ratios among the resistors $R_{11}$, $R_{12}$, $R_{13}$ and $R_{14}$ according to the voltage levels Va1, Va2, Va3 and Va4 of the second trace 2121 respectively measured within the periods $T_1$, $T_2$, $T_3$ and $T_4$. Similarly, the voltage levels of each of the second traces 2122 to 2124 measured within the periods $T_1$, $T_2$, $T_3$ and $T_4$ could be obtained by the measurement circuit 230 in a similar way.

Moreover, based on the equation (4), the resistance of the variable resistor $R_{12}$ could be represented as follows since the resistor $R_{11}$ has a constant resistance:

$$R_{12} = \frac{Da1}{Da2} \times R_{11} = \frac{Va1}{Va2} \times R_{11} \qquad (5)$$

Similarly, the resistances of the variable resistors $R_{13}$ and $R_{14}$ could be represented as follows:

$$R_{13} = \frac{Da1}{Da3} \times R_{11} = \frac{Va1}{Va3} \times R_{11} \qquad (6)$$

$$R_{14} = \frac{Da1}{Da4} \times R_{11} = \frac{Va1}{Va4} \times R_{11} \qquad (7)$$

Where Da3 is a digital value outputted from the ADC 2321 when the voltage level of the second trace 2121 is measured as Va3 within the period $T_3$, and Da4 is a digital value outputted from the ADC 2321 when the voltage level of the second trace 2121 is measured as Va4 within the period $T_4$. Since the resistances of the variable resistors $R_{12}$, $R_{13}$ and $R_{14}$ of the first row of the resistor matrix 210 could be obtained as described above, it could be understood that the resistance of each of other variable resistors $R_{22}$ to $R_{24}$, $R_{32}$ to $R_{34}$ and $R_{42}$ to $R_{44}$ coupled to other rows of the resistor matrix 210 could be determined in a similar way.

Accordingly, the resistance of any variable resistor is equal to $$\frac{ADC1 \times R_{REF}}{ADC2},$$

where $R_{REF}$ is resistance of a reference resistor (e.g. $R_{11}$) located in a same row with the variable resistor, ADC1 is a voltage level (e.g. Va1) of the second end of the variable resistor measured within the period $T_1$, and ADC2 is a voltage level (e.g. Va2) of the second end of the variable resistor when the first end of the variable resistor is applied with the first voltage V1.

As mentioned previously, the resistors $R_{11}$, $R_{21}$, $R_{31}$ and $R_{41}$ are reference resistors and have constant resistances. In an embodiment of the present invention, the resistances of the resistors $R_{11}$, $R_{21}$, $R_{31}$ and $R_{41}$ are the same. In an embodiment of the present invention, the resistances of the resistors $R_{11}$, $R_{21}$, $R_{31}$ and $R_{41}$ may different from each other. The resistors $R_{12}$ to $R_{14}$, $R_{22}$ to $R_{24}$, $R_{32}$ to $R_{34}$ and $R_{42}$ to $R_{44}$ are variable resistors. When the input device 200 is touched or depressed with an external force, the resistances of the resistors $R_{12}$ to $R_{14}$, $R_{22}$ to $R_{24}$, $R_{32}$ to $R_{34}$ and $R_{42}$ to $R_{44}$ may be changed, such that the voltage levels of the second traces 2121 to 2124 measured within the periods $T_1$, $T_2$, $T_3$ and $T_4$ are changed accordingly. Therefore, if any touch point of the input device 200 exists, the coordinates of the touch point could be determined according to the voltage levels of each of the second traces 2121 to 2124 measured within the periods $T_1$, $T_2$, $T_3$ and $T_4$.

In an embodiment of the present invention, the measurement circuit 230 comprises a lookup table (LUT) 233. The measurement circuit 230 selects the resistances of the variable resistors $R_{12}$ to $R_{14}$, $R_{22}$ to $R_{24}$, $R_{32}$ to $R_{34}$ and $R_{42}$ to $R_{44}$ from the lookup table 233 according to the voltage levels of the second traces 2121 to 2124 measured within the periods $T_1$, $T_2$, $T_3$ and $T_4$. For example, the resistance of the variable resistor $R_{12}$ is selected from the lookup table 233 according to the voltage levels Va1 and Va2 measured within the periods $T_1$ and $T_2$; the resistance of the variable resistor $R_{13}$ is selected from the lookup table 233 according to the voltage levels Va1 and Va3 measured within the periods $T_1$ and $T_3$; and the resistance of the variable resistor $R_{14}$ is selected from the lookup table 233 according to the voltage levels Va1 and Va4 measured within the periods $T_1$ and $T_4$.

Figure 6:
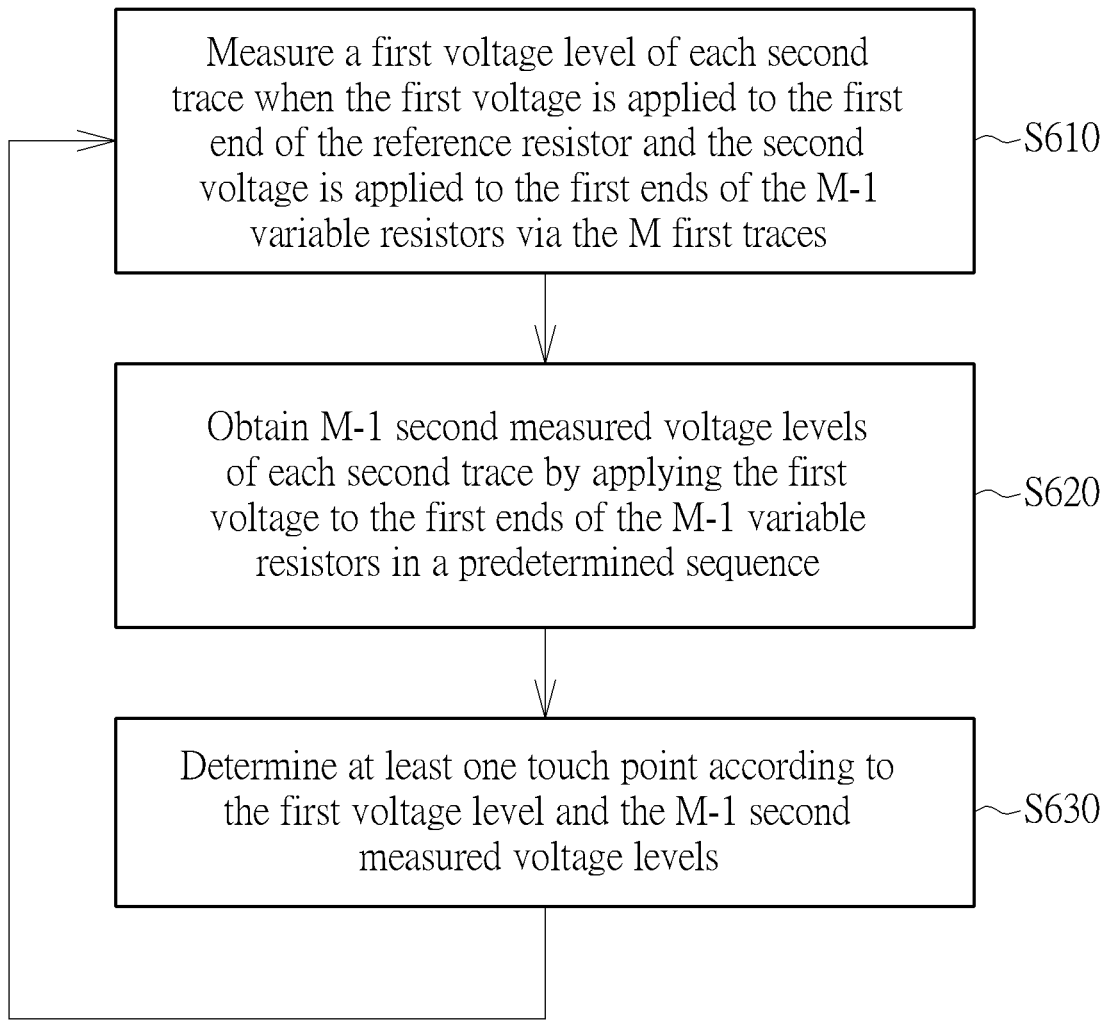
FIG. 6 is a flow chart of a method of controlling operations of the input device in FIG. 2 according to an embodiment of the present invention.

Please refer to FIG. 6, which is a flow chart of a method of controlling operations of the input device 200 according to an embodiment of the present invention. The method comprises the following steps:

Step S610: Measure a first voltage level (e.g. Va1) of each second trace when the first voltage V1 is applied to the first end of the reference resistor (e.g. $R_{11}$) of each row and the second voltage V2 is applied to the first ends of the M−1 variable resistors (e.g. $R_{12}$, $R_{13}$ and $R_{14}$) of each row via the M first traces;

Step S620: Obtain M−1 second measured voltage levels (e.g. Va2, Va3 and Va4) of each second trace by applying the first voltage V1 to the first ends of the M−1 variable resistors of each row in a predetermined sequence (e.g. $R_{12} \rightarrow R_{13} \rightarrow R_{14}$); and Step S630: Determine at least one touch point of the input device 200 according to the first voltage level and the M−1 second measured voltage levels of each second trace.

It should be noted that, in step S620, when the first voltage V1 is applied the first end of one (e.g. $R_{12}$) of the M−1 variable resistors of each row of the resistor matrix 210, the second voltage V2 is applied to first ends of the reference resistor (e.g. $R_{11}$) and remaining M−2 variable resistors (e.g. $R_{13}$ and $R_{14}$) of the row. Moreover, steps S610, S620 and S630 may be repeated to determine another touch point of the input device 200 at a different time.

Figure 7:
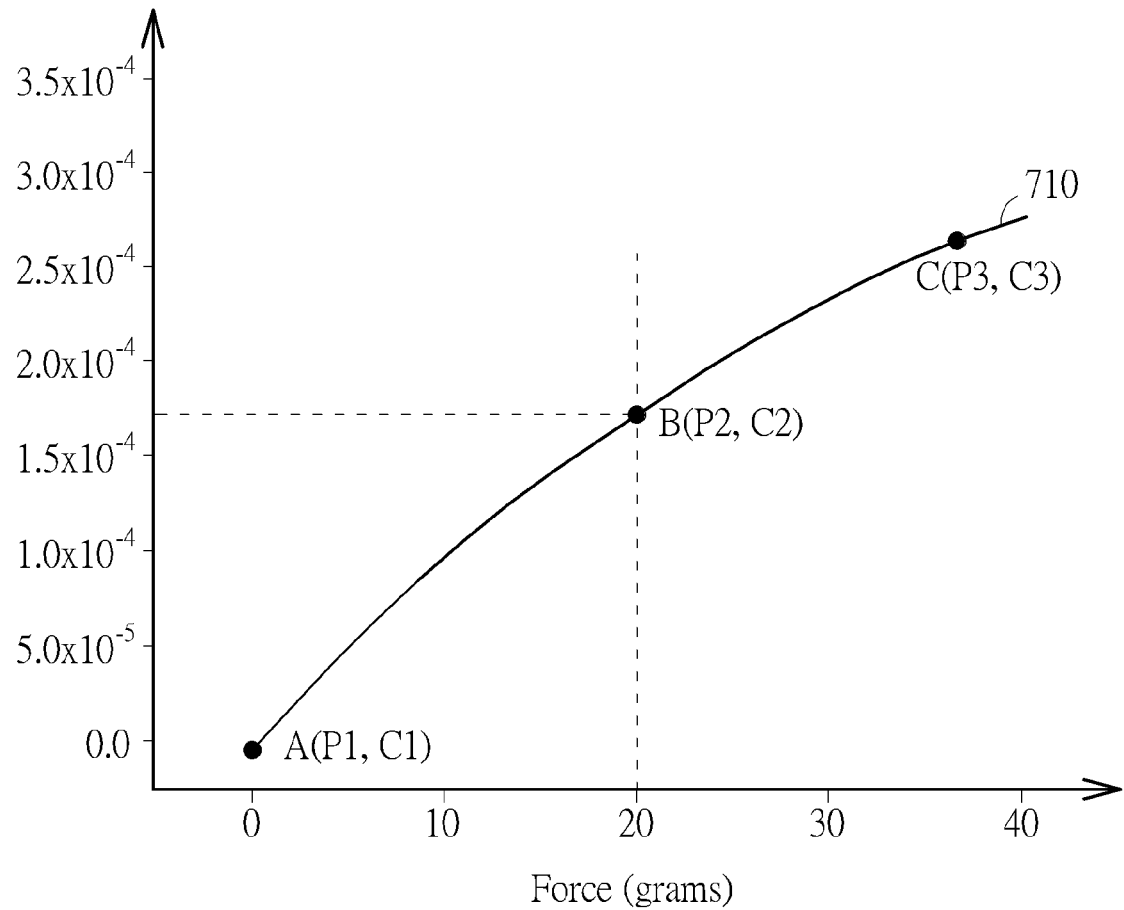
FIG. 7 is a relationship diagram of the conductance of a variable resistor and the force applied to the variable resistor.

In an embodiment of the present invention, the measurement circuit 230 may obtain and output information of strength of a force applied to the touch point, and the information of the strength of the force may be included in the control signal Sc. Please refer to FIGS. 2 and 7. FIG. 7 is a relationship diagram of the conductance of a variable resistor and the force applied to the variable resistor. The conductance of the variable resistor is equal to a reciprocal of the measured resistance of the variable resistor. In the embodiment, the variable resistors $R_{12}$ to $R_{14}$, $R_{22}$ to $R_{24}$, $R_{32}$ to $R_{34}$ and $R_{42}$ to $R_{44}$ have the same relationship between the conductance of the variable resistors and strength of the force applied thereon, and a curve 710 may represent the relationship between the conductance of each of variable resistors $R_{12}$ to $R_{14}$, $R_{22}$ to $R_{24}$, $R_{32}$ to $R_{34}$ and $R_{42}$ to $R_{44}$ and the force applied thereon. As shown in FIG. 7, the conductance of the variable resistor and the strength of the force substantially have a linear relationship. Therefore, the strength of the force could be determined by using an interpolation algorithm. For example, it is assumed that the coordinates (P1, C1) and (P3, C3) of two points A and C of the curve 710 have been known. Then, the coordinates (P2, C2) of another point B of the curve 710 could be determined according to the coordinates (P1, C1) and (P3, C3) of the points A and C. That is, P2={[(C2−C1)×(P3−P1)/(C3−C1)]+P1}. Since the conductance of the variable resistor is equal to the reciprocal of the measured resistance of the variable resistor, the strength P2 could be determined if the values of conductance C1, C2 and C3 and the strength P1 and P2 have been known.

In an embodiment of the present invention, it could be assumed that a force is applied to the variable resistor $R_{12}$, and the strength of the force is $S_{12}$. Since the resistance of the variable resistor $R_{12}$ is equal to $$\frac{Va1}{Va2} \times R_{11},$$

the conductance of the variable resistor $R_{12}$ is equal to the reciprocal $$\left(\text{i.e. } 1/R_{12} \text{ or } \frac{Va2}{Va1 \times R_{11}}\right)$$

of the variable resistor $R_{12}$, and the conductance of the variable resistor $R_{12}$ and the strength $S_{12}$ of the force substantially have a linear relationship, the strength $S_{12}$ of the force could be obtained according to a function of $$\frac{Va2}{Va1 \times R_{11}}.$$

The function of $$\frac{Va2}{Va1 \times R_{11}},$$

for example, could be represented as follows:

$$S_{12} = a \times \frac{Va2}{Va1 \times R_{11}} + b \qquad (8)$$

Where the parameters a and b are constants.
Moreover, since $$\frac{Va2}{Va1 \times R_{11}}$$

is equal to $$\frac{Da2}{Da1 \times R_{11}},$$

the strength $S_{12}$ of the force also could be represented as follows:

$$S_{12} = a \times \frac{Da2}{Da1 \times R_{11}} + b \qquad (9)$$

Accordingly, the strength of the force applied to any variable resistor (or touch point) of the input device 200 could be obtained according to a function of $$\left(\frac{ADC2}{ADC1 \times R_{REF}}\right),$$

where $R_{REF}$ is resistance of a reference resistor (e.g. $R_{11}$) located in a same row with the variable resistor, ADC1 is a voltage level (e.g. Va1) of the second end of the variable resistor measured within the period $T_1$, and ADC2 is a voltage level (e.g. Va2) of the second end of the variable resistor when the first end of the variable resistor is applied with the first voltage V1.

In an embodiment of the present invention, the variable resistors $R_{12}$ to $R_{14}$, $R_{22}$ to $R_{24}$, $R_{32}$ to $R_{34}$ and $R_{42}$ to $R_{44}$ have the same relationship between the conductance of the variable resistors and strength of the force applied thereon, and the measurement circuit 230 further comprises a lookup table (LUT) 236. The measurement circuit 230 selects the strength of forces applied on the variable resistors $R_{12}$ to $R_{14}$, $R_{22}$ to $R_{24}$, $R_{32}$ to $R_{34}$ and $R_{42}$ to $R_{44}$ from the lookup table 236 according to the voltage levels of the second traces 2121 to 2124 measured within the periods $T_1$, $T_2$, $T_3$ and $T_4$. For example, strength of a force applied on the variable resistors $R_{12}$ is selected from the lookup table 236 according to the voltage levels Va1 and Va2 measured within the periods $T_1$ and $T_2$; strength of a force applied on the variable resistors $R_{13}$ is selected from the lookup table 236 according to the voltage levels Va1 and Va3 measured within the periods $T_1$ and $T_3$; and strength of a force applied on the variable resistors $R_{14}$ is selected from the lookup table 236 according to the voltage levels Va1 and Va4 measured within the periods $T_1$ and $T_4$. Therefore, the resistance of each variable resistor not only can be calculated according to the formula of $$\frac{ADC1 \times R_{REF}}{ADC2},$$

but also can be obtained from the lookup table 236 according to the voltage levels of the second traces 2121 to 2124 measured within the periods $T_1$, $T_2$, $T_3$ and $T_4$.

In an embodiment of the present invention, the variable resistors $R_{12}$ to $R_{14}$, $R_{22}$ to $R_{24}$, $R_{32}$ to $R_{34}$ and $R_{42}$ to $R_{44}$ have the same relationship between the conductance of the variable resistors and strength of the force applied thereon, and the measurement circuit 230 selects the strength of the force applied to the touch point from the lookup table 236 according to the resistance of the variable resistor at the touch point. For example, the strength of a force applied to the variable resistor $R_{12}$ is selected from the lookup table 236 according to the resistance of the variable resistor $R_{12}$; the strength of a force applied to the variable resistor $R_{13}$ is selected from the lookup table 236 according to the resistance of the variable resistor $R_{13}$; and the strength of a force applied to the variable resistor $R_{14}$ is selected from the lookup table 236 according to the resistance of the variable resistor $R_{14}$.

In an embodiment of the present invention, the variable resistors $R_{12}$ to $R_{14}$, $R_{22}$ to $R_{24}$, $R_{32}$ to $R_{34}$ and $R_{42}$ to $R_{44}$ have the same relationship between the conductance of the variable resistors and strength of the force applied thereon, and the conductance of each variable resistor and the strength of the force have a nonlinear relationship. However, by using the lookup table 236, the strength of forces applied on the variable resistors $R_{12}$ to $R_{14}$, $R_{22}$ to $R_{24}$, $R_{32}$ to $R_{34}$ and $R_{42}$ to $R_{44}$ could be determined accurately.

In an embodiment of the present invention, only when the strength of the force applied to the touch point is greater than or equal to a predetermined threshold (e.g. 20 grams), the touch point is determined to being triggered. In other words, if the strength of the force applied to the touch point is less than the predetermined threshold, the touch point is determined to be un-triggered. Accordingly, if the strength of the force applied to the touch point is not great enough, the touch point would be regarded as an invalid touch point. In an embodiment, the measurement circuit 230 may further comprise another lookup table 235 for recording the predetermined threshold.

Figure 8:
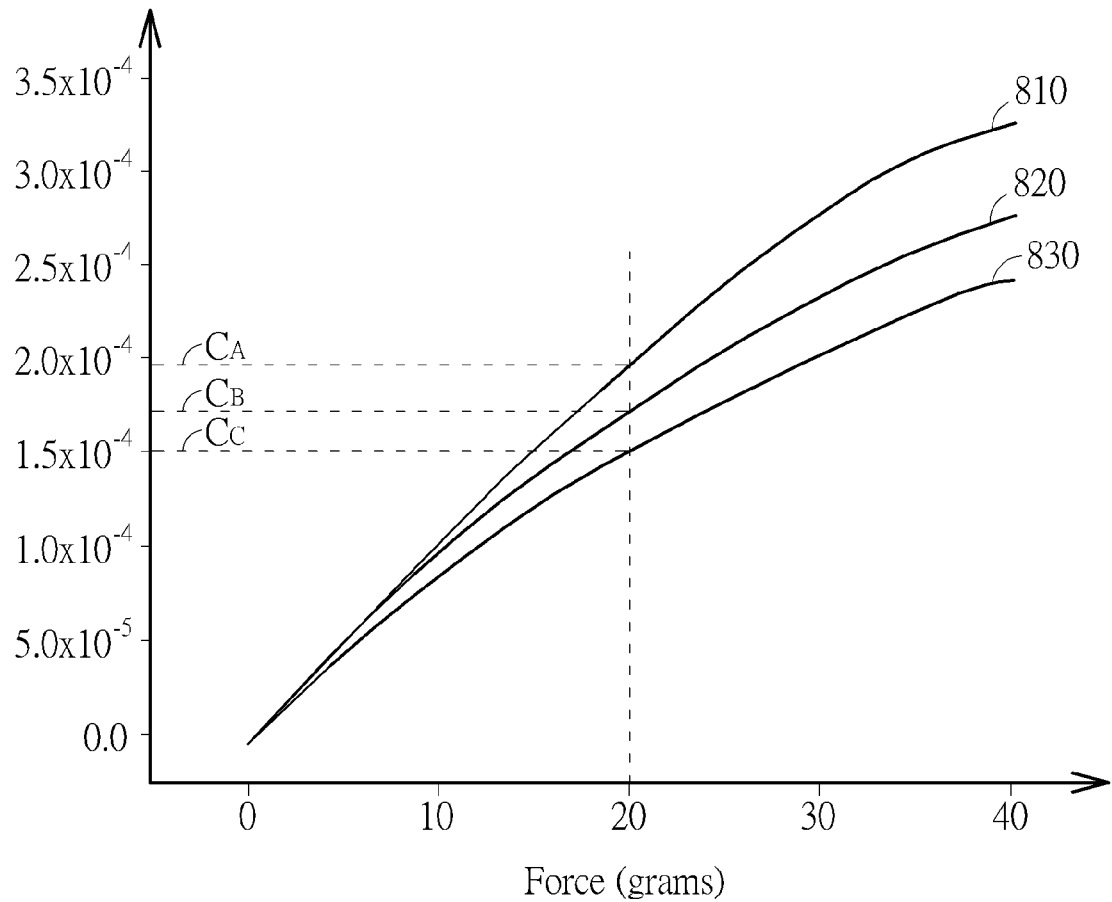
FIG. 8 is a relationship diagram of the conductance of three different variable resistors and the forces applied to the three variable resistors.

Please refer to FIGS. 2 and 8. FIG. 8 is a relationship diagram of the conductance of three different variable resistors and the forces applied to the three variable resistors. In the embodiment, the variable resistors $R_{12}$ to $R_{14}$, $R_{22}$ to $R_{24}$, $R_{32}$ to $R_{34}$ and $R_{42}$ to $R_{44}$ have different relationships between the conductance of the variable resistors and strength of forces applied thereon, and curves 810, 820 and 830 may represent the relationships between the conductance of three of the variable resistors $R_{12}$ to $R_{14}$, $R_{22}$ to $R_{24}$, $R_{32}$ to $R_{34}$ and $R_{42}$ to $R_{44}$ and the forces applied thereon. As shown in FIG. 8, the conductance of the variable resistors and the strength of the forces substantially have linear relationships. Therefore, the strength of each force could also be determined by using an interpolation algorithm. Moreover, in the embodiment, only when the strength of the force applied to the touch point is greater than or equal to the predetermined threshold (e.g. 20 grams), the touch point is determined to being triggered. Since the variable resistors $R_{12}$ to $R_{14}$, $R_{22}$ to $R_{24}$, $R_{32}$ to $R_{34}$ and $R_{42}$ to $R_{44}$ have different relationships between the conductance of the variable resistors and strength of forces applied thereon, the values of the conductance $C_A$, $C_B$ and $C_C$ corresponded to the predetermined threshold are different from each other.

In an embodiment of the present invention, the variable resistors $R_{12}$ to $R_{14}$, $R_{22}$ to $R_{24}$, $R_{32}$ to $R_{34}$ and $R_{42}$ to $R_{44}$ have different relationships between the conductance of the variable resistors and strength of forces applied thereon, and the measurement circuit 230 further comprises a plurality of lookup tables (LUT) 234_12 to 234_44. Each of the lookup tables 234_12 to 234_44 corresponds to one of the variable resistors $R_{12}$ to $R_{14}$, $R_{22}$ to $R_{24}$, $R_{32}$ to $R_{34}$ and $R_{42}$ to $R_{44}$. The measurement circuit 230 selects the strength of the force from a corresponding lookup table according to the voltage levels of a corresponding second trace measured within corresponding periods. For example, the strength of a force applied to the variable resistor $R_{12}$ is selected from the lookup table 234_12 according to the voltage levels Va1 and Va2 of the second trace 2121 measured within the periods $T_1$ and $T_2$; the strength of a force applied to the variable resistor $R_{13}$ is selected from the lookup table 234_13 according to the voltage levels Va1 and Va3 of the second trace 2121 measured within the periods $T_1$ and $T_3$; and the strength of a force applied to the variable resistor $R_{14}$ is selected from the lookup table 234_14 according to the voltage levels Va1 and Va4 of the second trace 2121 measured within the periods $T_1$ and $T_4$.

In an embodiment of the present invention, when a touch point of the input device 200 is determined, a first coordinate (i.e. location of corresponding row of resistor matrix 210) and a second coordinate (i.e. location of corresponding column of the resistor matrix 210) of the touch point would be determined by the measurement circuit 230, and the measurement circuit 230 selects a lookup table from the plurality of lookup tables 234_12 to 234_44 according to the first coordinate and the second coordinate of the touch point. Then, the measurement circuit 230 selects the strength of a force applied to a variable resistor located in the touch point from the selected lookup table.

In an embodiment of the present invention, the variable resistors $R_{12}$ to $R_{14}$, $R_{22}$ to $R_{24}$, $R_{32}$ to $R_{34}$ and $R_{42}$ to $R_{44}$ have different relationships between the conductance of the variable resistors and strength of forces applied thereon. When the corresponding lookup table is selected according to the first coordinate and the second coordinate of the touch point, the measurement circuit 230 selects the strength of the force from the selected lookup table according to the resistance of the variable resistor at the touch point. For example, the strength of a force applied to the variable resistor $R_{12}$ is selected from the lookup table 234_12 according to the resistance of the variable resistor $R_{12}$; the strength of a force applied to the variable resistor $R_{13}$ is selected from the lookup table 234_13 according to the resistance of the variable resistor $R_{13}$; and the strength of a force applied to the variable resistor $R_{14}$ is selected from the lookup table 234_14 according to the resistance of the variable resistor $R_{14}$.

In an embodiment of the present invention, the variable resistors $R_{12}$ to $R_{14}$, $R_{22}$ to $R_{24}$, $R_{32}$ to $R_{34}$ and $R_{42}$ to $R_{44}$ have different relationships between the conductance of the variable resistors and strength of forces applied thereon, and the conductance of each variable resistor and the strength of the force applied thereon have a nonlinear relationship. However, by using the lookup tables 234_12 to 234_44, the strength of forces applied on the variable resistors $R_{12}$ to $R_{14}$, $R_{22}$ to $R_{24}$, $R_{32}$ to $R_{34}$ and $R_{42}$ to $R_{44}$ could be determined accurately.

Figure 9:
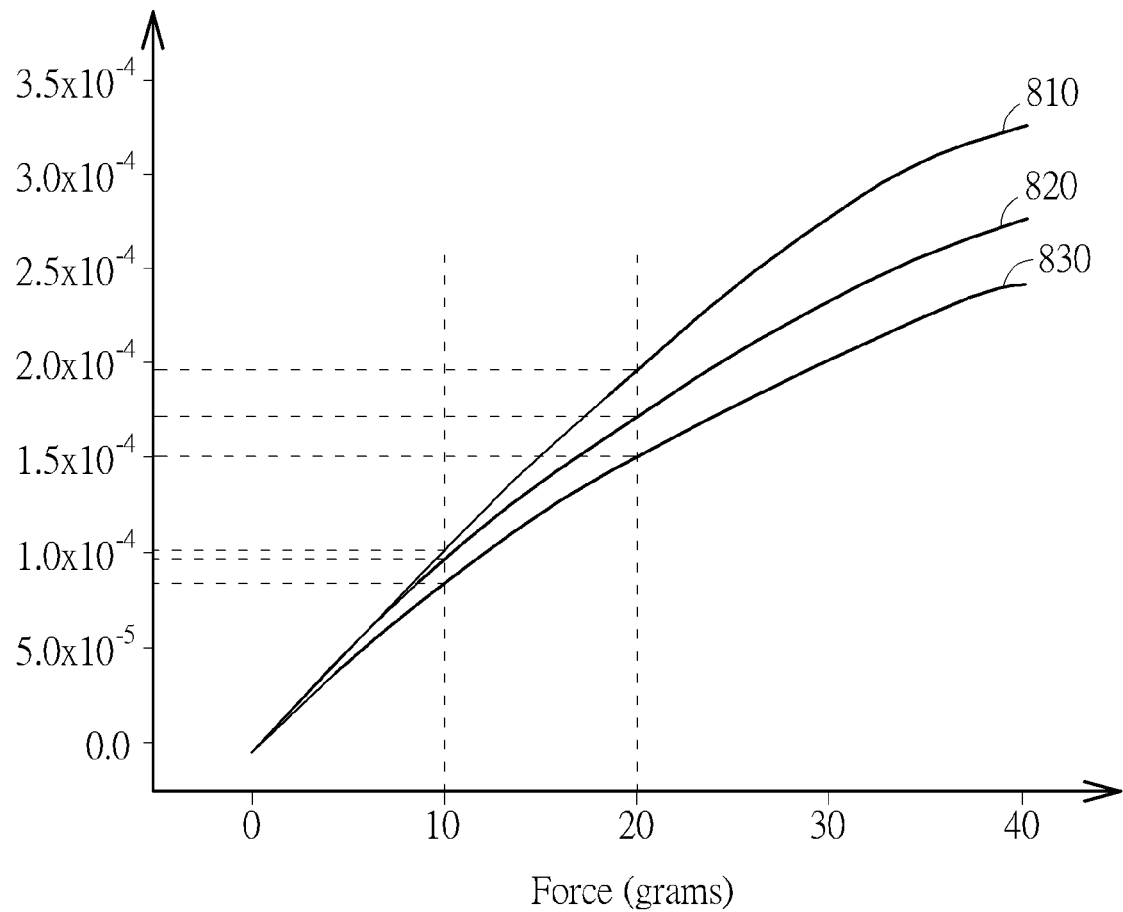
FIG. 9 is another relationship diagram of the conductance of three different variable resistors and the forces applied to the three variable resistors.

In an embodiment of the present invention, the measurement circuit 230 outputs the control signal Sc according to the strength of the force applied to the touch point. Please refer to FIGS. 2 and 9. FIG. 9 is another relationship diagram of the conductance of three different variable resistors and the forces applied to the three variable resistors. In the embodiment, if the strength of the force is greater than or equal to a first predetermined value (e.g. 20 grams), the control signal Sc is a first control signal. If the strength of the force is less than the first predetermined value (e.g. 20 grams) and not less than a second predetermined value (e.g. 10 grams), the control signal Sc is a second control signal, where the second predetermined value is less than the first predetermined value, and the first control signal is different from the second control signal. Accordingly, if the input device 200 is used to control an electric apparatus (e.g. a computer, a mobile phone, etc.), the operations of electric apparatus may be different based on different control signals received from the input device 200. In an embodiment, the measurement circuit 230 may select the first predetermined value and the second predetermined value from the lookup table 235.

Figure 10:
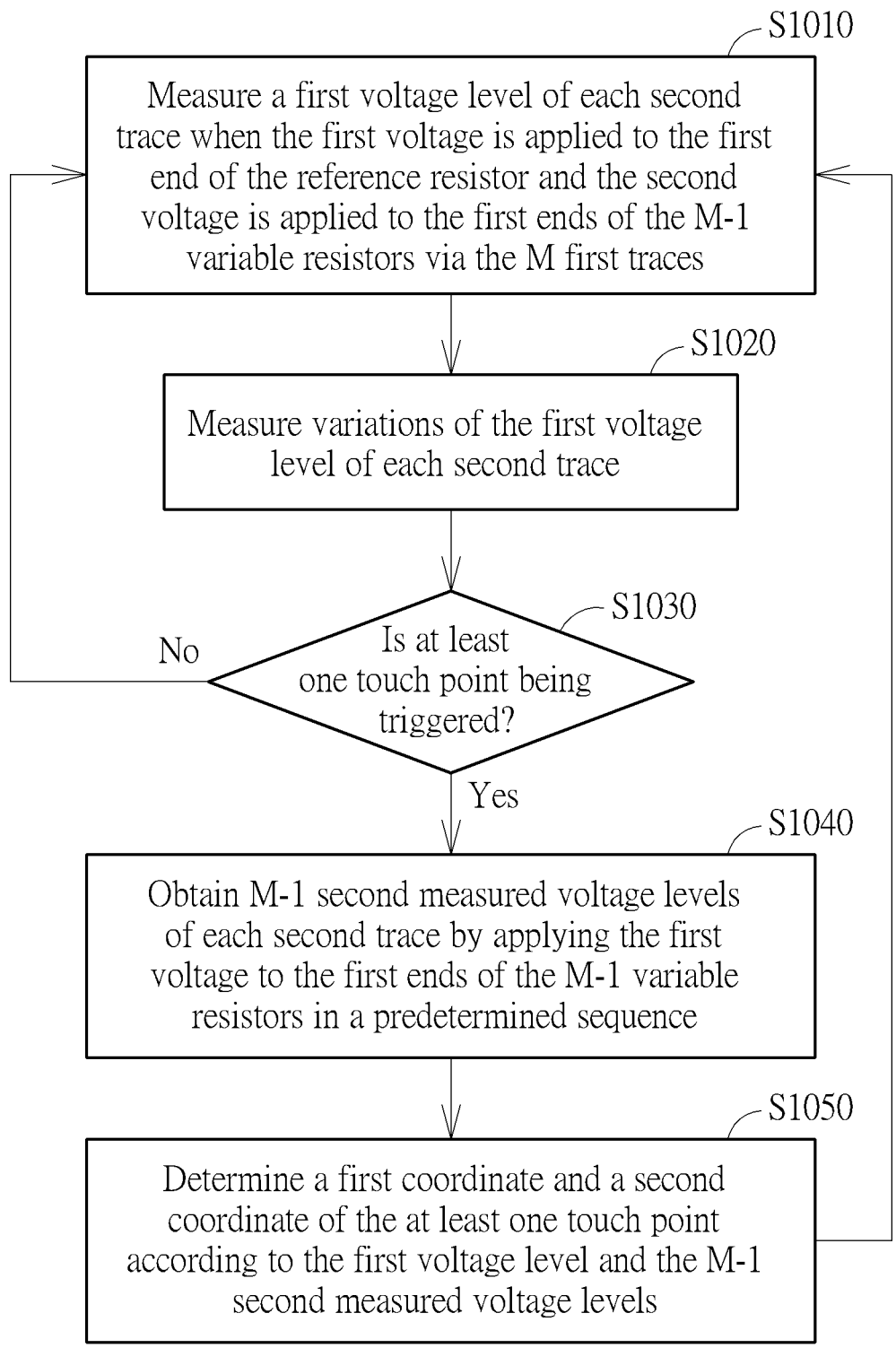
FIG. 10 is a flow chart of a method of controlling operations of the input device in FIG. 2 according to another embodiment of the present invention.

Please refer to FIG. 10. FIG. 10 is a flow chart of a method of controlling operations of the input device in FIG. 2 according to another embodiment of the present invention. In the embodiment, the method comprises the following steps:

Step S1010: Measure a first voltage level (e.g. Va1) of each second trace when the first voltage V1 is applied to the first end of the reference resistor (e.g. $R_{11}$) of each row and the second voltage V2 is applied to the first ends of the M−1 variable resistors (e.g. $R_{12}$, $R_{13}$ and $R_{14}$) of each row via the M first traces;

Step S1020: Measure variations of the first voltage level (e.g. Va1) of each second trace (i.e. the second traces 2121 to 2124);

Step S1030: Determine whether at least one touch point is triggered according to the variations of the first voltage level (e.g. Va1) of the each second trace; if the result is positive, step S1040 will be executed; otherwise, steps S1010 to S1030 will be repeated;

Step S1040: Obtain M−1 second measured voltage levels (e.g. Va2, Va3 and Va4) of each second trace by applying the first voltage V1 to the first ends of the M−1 variable resistors of each row in a predetermined sequence (e.g. $R_{12} \rightarrow R_{13} \rightarrow R_{14}$); and Step S1050: Determine a first coordinate (i.e. location of corresponding row of resistor matrix 210) and a second coordinate (i.e. location of corresponding column of the resistor matrix 210) of the at least one touch point according to the first voltage level and the M−1 second measured voltage levels.

It should be noted that, in step S1040, when the first voltage V1 is applied the first end of one (e.g. $R_{12}$) of the M−1 variable resistors of each row of the resistor matrix 210, the second voltage V2 is applied to first ends of the reference resistor (e.g. $R_{11}$) and remaining M−2 variable resistors (e.g. $R_{13}$ and $R_{14}$) of the row. Moreover, since steps S1040 and S1050 will not be executed until at least one touch point is determined to being triggered in step S1030, the first voltage V1 is constantly applied to the first ends of the reference resistors $R_{11}$, $R_{12}$, $R_{13}$ and $R_{14}$ and the second voltage V2 is constantly applied to first ends of the variable resistors $R_{12}$ to $R_{14}$, $R_{22}$ to $R_{24}$, $R_{32}$ to $R_{34}$ and $R_{42}$ to $R_{44}$ until at least one touch point is determined to being triggered.

Refer to FIG. 2 again. The second traces 2121 to 2124 may be coupled to a general-purpose input/output (GPIO) circuit 240 of the measurement circuit 230, and the GPIO circuit 240 may detect the variations of the voltage levels Va, Vb, Vc and Vd of the second traces 2121 to 2124 while steps S1010 and S1030 are executed. When any of the first voltage levels Va, Vb, Vc and Vd satisfies predetermined criteria, the GPIO circuit 240 outputs a wake-up signal Sw, and the input device 200 determines that at least one touch point is determined to being triggered, such that the steps S1040 and S1050 are executed. The predetermined criteria, for example, could be that any of the voltage levels Va, Vb, Vc and Vd detected by the GPIO circuit 240 is greater than or less than a predetermined level (e.g. 1.5 volts). In the embodiment, when the voltage level of the wake-up signal Sw is equal to a first level VH, it means that at least one touch point is determined to being triggered. However, when the voltage level of the wake-up signal Sw is equal to a second level VL, it means that no triggered touch point is determined.

Figure 11:
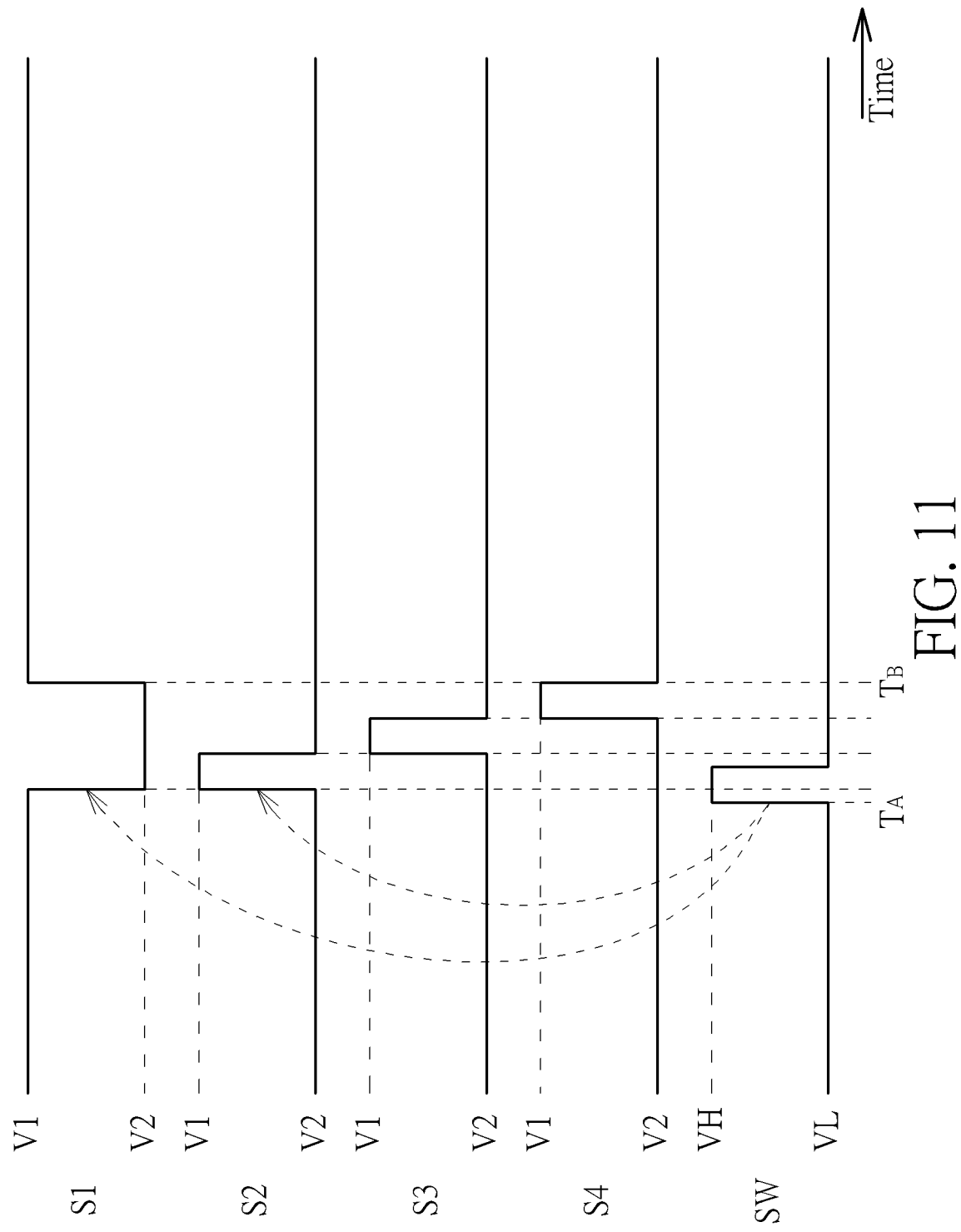
FIG. 11 is a timing diagram of voltage signals of the input device in FIG. 2 which operates according to the method of FIG. 10.

Please refer to FIG. 11 with reference of FIGS. 2 and 10. FIG. 11 is a timing diagram of voltage signals of the input device in FIG. 2 which operates according to the method of FIG. 10. At time of $T_A$, the voltage level of the wake-up signal Sw is pulled up from the second level VL to the first level VH. In response to the raising of the wake-up signal Sw, step S1040 is executed, such that the voltage level of the voltage signal S1 is pulled down from the first voltage V1 to the second voltage V2, and that the voltage levels of the voltage signals S2, S3 and S4 are sequentially pulled up from the second voltage V2 to the first voltage V1. Accordingly, during the duration between $T_A$ and $T_B$, M−1 second measured voltage levels (e.g. Va2, Va3 and Va4) of each second trace are obtained (step S1040). Moreover, after the time of $T_B$, since the voltage level of the wake-up signal Sw is equal to the second level VL, the first voltage V1 is constantly applied to the first ends of the reference resistors $R_{11}$, $R_{12}$, $R_{13}$ and $R_{14}$ and the second voltage V2 is constantly applied to first ends of the variable resistors $R_{12}$ to $R_{14}$, $R_{22}$ to $R_{24}$, $R_{32}$ to $R_{34}$ and $R_{42}$ to $R_{44}$ until another touch point is determined to being triggered.

Figure 12:
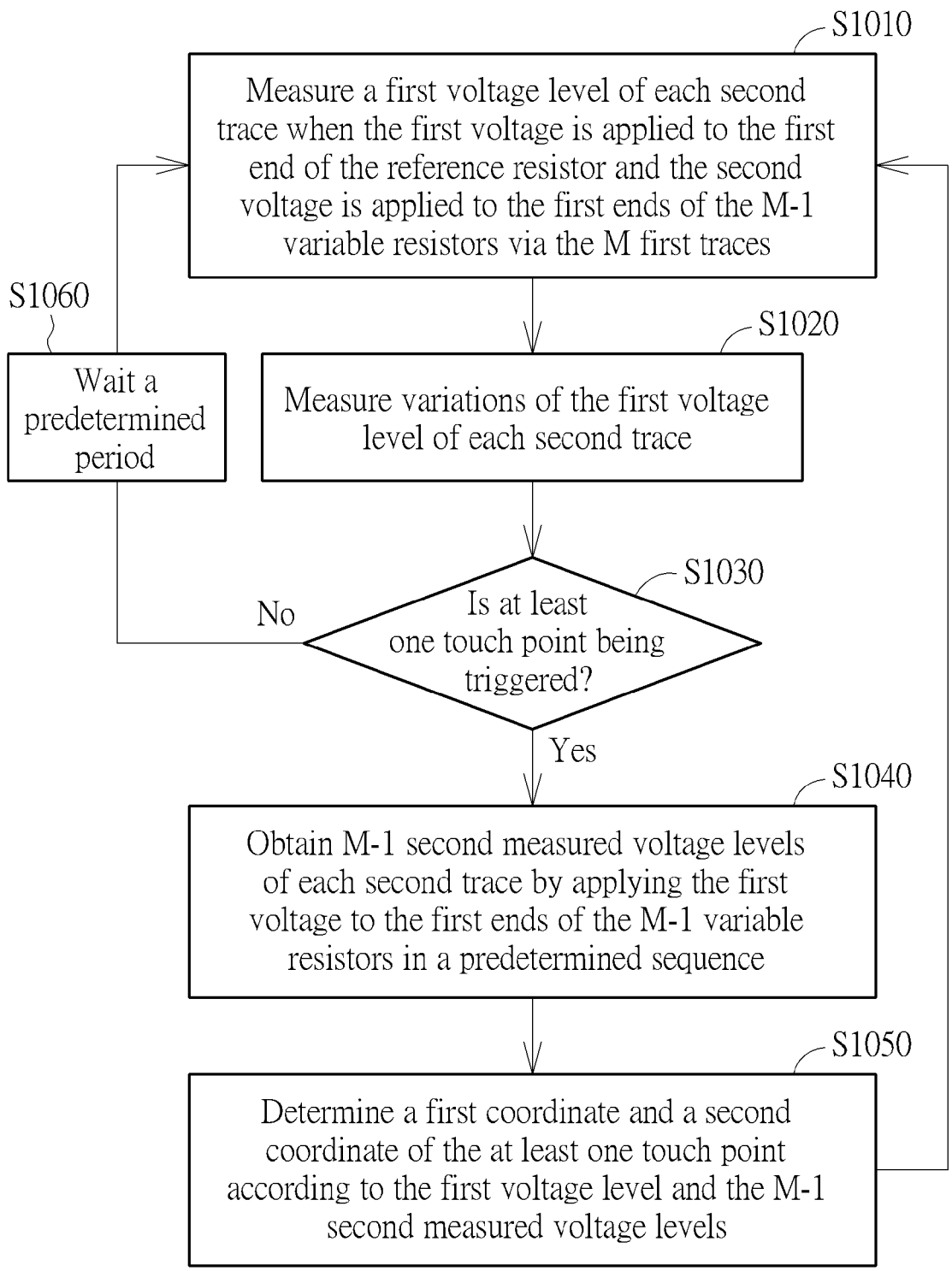
FIG. 12 is a flow chart of a method of controlling operations of the input device in FIG. 2 according to an embodiment of the present invention.

Please refer to FIG. 12. FIG. 12 is a flow chart of a method of controlling operations of the input device in FIG. 2 according to an embodiment of the present invention. As compared to the method illustrated in FIG. 10, the method of the present embodiment further comprises step S1060. If no triggered touch point is determined in step S1030, step S1060 will be executed. Therefore, step S1010 will be executed when step S1030 is completed after a predetermined period. Accordingly, steps S1010, S1020 and S1030 are repeated at regular intervals. Moreover, during the predetermined period, the first voltage V1 is not applied to the resistor matrix 210. As a result, the power consumption of the input device 200 could be reduced. In an embodiment of the present invention, the predetermined period could be 0.5 second. However, the present invention is not limited thereto.

Figure 13:
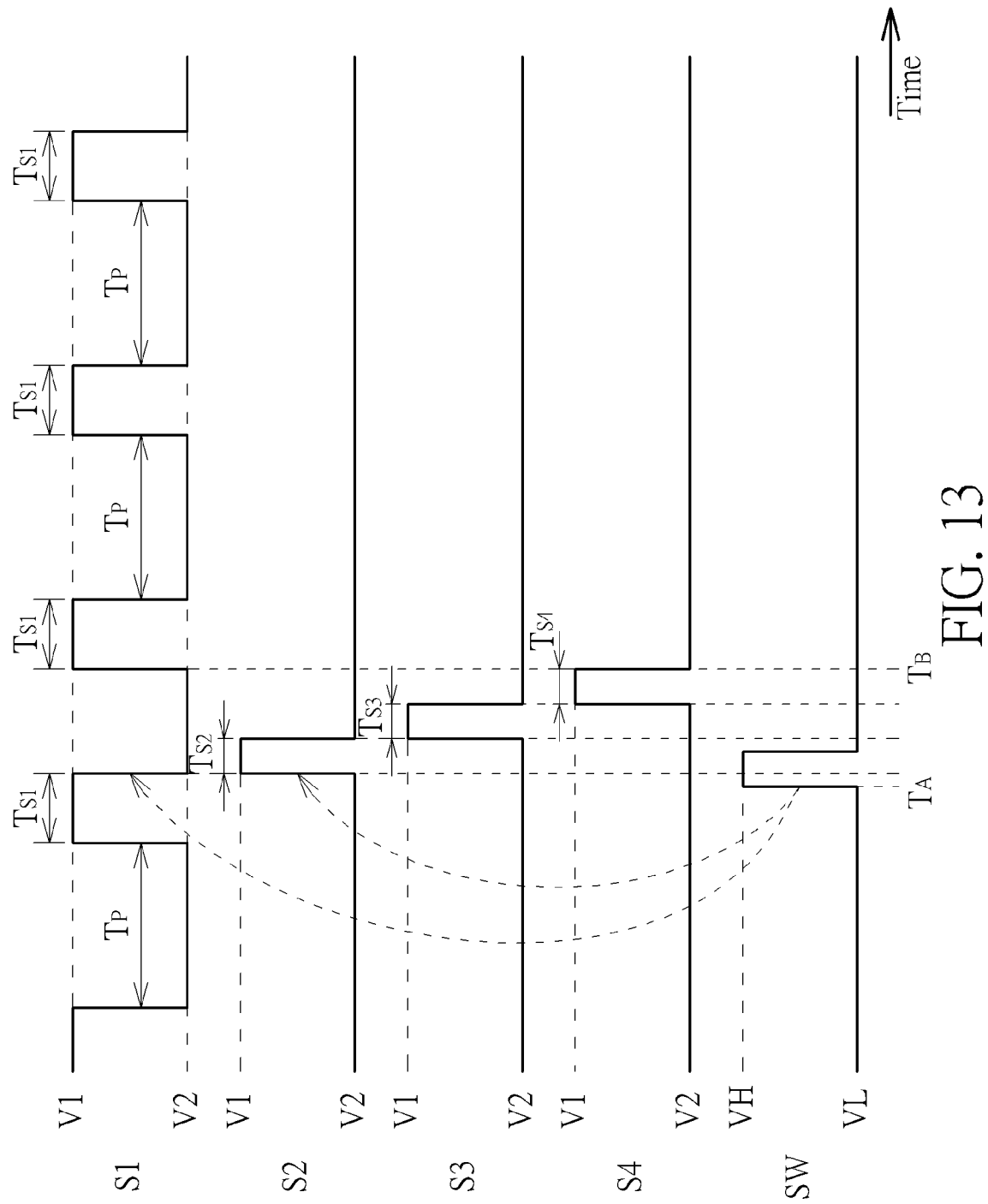
FIG. 13 is a timing diagram of voltage signals of the input device in FIG. 2 which operates according to the method of FIG. 12.

Please refer to FIG. 13 with reference of FIGS. 2 and 12. FIG. 13 is a timing diagram of voltage signals of the input device in FIG. 2 which operates according to the method of FIG. 12. Similarly, at time of $T_A$, the voltage level of the wake-up signal Sw is pulled up from the second level VL to the first level VH. In response to the raising of the wake-up signal Sw, step S1040 is executed, such that the voltage level of the voltage signal S1 is pulled down from the first voltage V1 to the second voltage V2, and that the voltage levels of the voltage signals S2, S3 and S4 are sequentially pulled up from the second voltage V2 to the first voltage. Accordingly, during the duration between $T_A$ and $T_B$, M−1 second measured voltage levels (e.g. Va2, Va3 and Va4) of each second trace are obtained (step SS1040). Moreover, after the time of $T_B$, since the voltage level of the wake-up signal Sw is equal to the second level VL, steps S1010 to S1030 are repeated at regular intervals. It assumed that the foresaid predetermined period is Tp. As shown in FIG. 13, the voltage levels of the voltage signals S1 to S4 within each predetermined period Tp are equal to the second voltage V2. It means that the first voltage V1 is not applied to the resistor matrix 210 within each predetermined period Tp. As a result, the power consumption of the input device 200 could be reduced.

Moreover, it assumed that the voltage signal S1 has a voltage level of V1 within a duration $T_{S1}$, the voltage signal S2 has a voltage level of V1 within a duration $T_{S2}$, the voltage signal S3 has a voltage level of V1 within a duration $T_{S3}$, and the voltage signal S4 has a voltage level of V1 within a duration $T_{S4}$. The predetermined period Tp may be greater than the duration $T_{S1}$, and the duration $T_{S1}$ may be greater than each of the durations $T_{S2}$, $T_{S3}$ and $T_{S4}$. However, the present invention is not limited thereto. For example, the duration $T_{S1}$ may less than or equal to each of the durations $T_{S2}$, $T_{S3}$ and $T_{S4}$.

Figure 14:
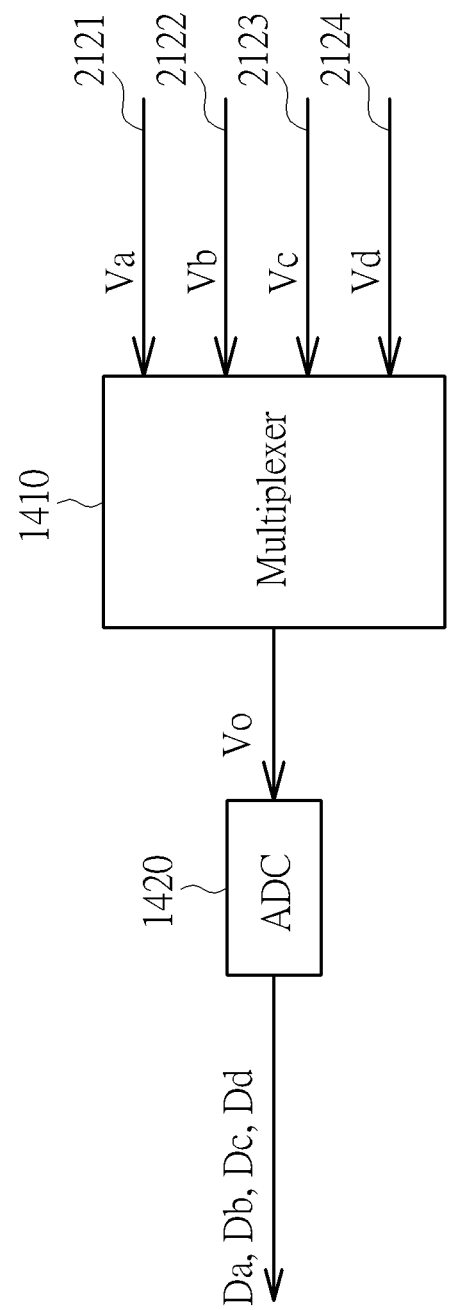
FIG. 14 is a functional block diagram of a multiplexer and an ADC of a measurement circuit according to another embodiment of the present invention.

In an embodiment of the present invention, the ADCs 2321 to 2324 in FIG. 2 could be replaced by a multiplexer 1410 and an ADC 1420 in FIG. 14. Please refer to FIGS. 3 and 14. The multiplexer 1410 has a plurality of input terminals coupled to the second traces 2121 to 2124. The multiplexer 1410 selects one of the voltage levels Va, Vb, Vc and Vd as an output voltage level Vo thereof, and the ADC 1420 converts the output voltage level Vo into the digital values Da, Db, Dc and Dd sequentially. For example, each of the periods $T_1$ to $T_4$ maybe divided into four sub-periods. During a first sub-period of the four sub-periods within each period $T_1$, $T_1$, $T_1$ or $T_4$, the multiplexer 1410 selects the voltage level Va as the output voltage level Vo, and the ADC 1420 converts the output voltage level Vo into the digital values Da. During a second sub-period of the four sub-periods within each period $T_1$, $T_1$, $T_1$ or $T_4$, the multiplexer 1410 selects the voltage level Vb as the output voltage level Vo, and the ADC 1420 converts the output voltage level Vo into the digital values Db. During a third sub-period of the four sub-periods within each period $T_1$, $T_1$, $T_1$ or $T_4$, the multiplexer 1410 selects the voltage level Vc as the output voltage level Vo, and the ADC 1420 converts the output voltage level Vo into the digital values Dc. During a fourth sub-period of the four sub-periods within each period $T_1$, $T_1$, $T_1$ or $T_4$, the multiplexer 1410 selects the voltage level Vd as the output voltage level Vo, and the ADC 1420 converts the output voltage level Vo into the digital values Dd. Accordingly, the number of the analog to digital converters (ADCs) of the measurement circuit 230 of the input device 200 could be reduced.

Additionally, since the resistance of each of the variable resistors $R_{12}$ to $R_{14}$, $R_{22}$ to $R_{24}$, $R_{32}$ to $R_{34}$ and $R_{42}$ to $R_{44}$ could be calculated independently, the input device 200 will not miscalculate the location of any touch point even when two or more touch points are triggered at the same time.

In summary, the present invention provides a method for controlling operations of an input device. The input device has a resistor matrix, which comprises a plurality of variable resistors. The variable resistors are pressure-sensitive, such that the resistances thereof would be changed due to any external force applied thereon. The strength of the external force can be calculated according to voltage levels measured within corresponded periods. Moreover, since the variable resistors may have the same or different relationships between the conductance of the variable resistors and strength of forces applied thereon, a lookup table or a plurality of lookup tables may be used to determine the resistances of the variable resistors and/or the strength of the external force. Additionally, any touch point of the input device could be determined to being trigged if the strength of the force applied thereon is greater than or equal to a predetermined threshold. Further, it is unnecessary to constantly apply the first voltage and the second voltage to the resistor matrix of the input device, such that the power consumption of the input device could be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling operations of an input device, the input device comprising a resistor matrix having M first traces, N second traces and M×N resistors, first ends of resistors of a same column being connected to one of the M first traces, second ends of resistors of a same row being connected to one of the N second traces, and each second trace being coupled to a reference resistor and M−1 variable resistors, M and N being integers greater than 1, the method comprising:

measuring a first voltage level of the each second trace when a first voltage is applied to a first end of the reference resistor and a second voltage is applied to first ends of the M−1 variable resistors via the M first traces;

measuring variations of the first voltage level of the each second trace; and determining at least one touch point of the input device according to the variations of the first voltage level of the each second trace.

2. The method of claim 1, wherein when the variations of the first voltage level satisfy predetermined criteria, the at least one touch point is determined to being triggered.

3. The method of claim 1 further comprising:
determining whether the at least one touch point of the input device is being triggered according to the variations of the first voltage level of the each second trace;
determining a first coordinate of the at least one touch point according to the variations of the first voltage level of the each second trace;
when the at least touch point is determined to being triggered, obtaining M−1 second measured voltage levels of a second trace at the first coordinate by applying the first voltage to first ends of M−1 variable resistors at the first coordinate via M−1 first traces within M−1 periods in a predetermined sequence, wherein when the first voltage is applied a first end of one of the M−1 variable resistors, the second voltage is applied to first ends of the reference resistor and remaining M−2 variable resistors; and
determining a second coordinate of the at least one touch point according to the first voltage level and the M−1 second measured voltage levels.

4. The method of claim 3 further comprising:
after obtaining the M−1 second measured voltage levels, stop applying the first voltage to the first ends of the M−1 variable resistors at the first coordinate, and keeping measuring the variations of the first voltage level of the each second trace by applying the first voltage to the first end of the reference resistor and applying the second voltage to the first ends of the M−1 variable resistors of each row of the resistor matrix so as to determine whether another touch point of the input device is being triggered.

5. The method of claim 1 further comprising:
obtaining M−1 second measured voltage levels of each second trace by applying the first voltage to the first ends of M−1 variable resistors in a predetermined sequence, wherein when the first voltage is applied a first end of one of the M−1 variable resistors, the second voltage is applied to first ends of the reference resistor and remaining M−2 variable resistors; and
determining a first coordinate and a second coordinate of the at least one touch point according to the first voltage level and the M−1 second measured voltage levels.

6. The method of claim 5 further comprising:
determining strength of a force applied to the at least one touch point according to the first voltage level and a second measured voltage level corresponded to the second coordinate.

7. The method of claim 6, wherein the strength of the force is obtained according to a function of $$\left(\frac{ADC2}{ADC1 \times R_{REF}}\right),$$

where ADC2 is the second measured voltage level corresponded to the second coordinate, ADC1 is the first voltage level, and $R_{REF}$ is resistance of the reference resistor.

8. The method of claim 6, wherein the strength of the force is determined by using an interpolation algorithm.

9. The method of claim 6, wherein the at least touch point is determined to being triggered if the strength of the force is greater than a predetermined threshold.

10. The method of claim 6, wherein determining the strength of the force applied to the at least one touch point according to the first voltage level and the second measured voltage level corresponded to the second coordinate comprises:
selecting a lookup table from a plurality of lookup tables according to the first coordinate and the second coordinate; and
selecting a corresponding value from the selected lookup table as the strength of the force according to the first voltage level and the second measured voltage level corresponded to the second coordinate.

11. The method of claim 6, wherein determining the strength of the force applied to the at least one touch point according to the first voltage level and the second measured voltage level corresponded to the second coordinate comprises:
selecting a corresponding value from a lookup table as the strength of the force according to the first voltage level and the second measured voltage level corresponded to the second coordinate.

12. The method of claim 6 further comprising:
outputting a control signal according to the strength of the force;
wherein if the strength of the force is greater than or equal to a first predetermined value, the control signal is a first control signal;
wherein if the strength of the force is less than the first predetermined value and not less than a second predetermined value, the control signal is a second control signal; and
wherein the second predetermined value is less than the first predetermined value, and the first control signal is different from the second control signal.

13. The method of claim 6 further comprising:
outputting information of the strength of the force.

14. The method of claim 5 further comprising:
determining resistances of the M−1 variable resistors at the first coordinate according to the first voltage level and the M−1 second measured voltage levels.

15. The method of claim 14, wherein the resistance of a variable resistor of the M−1 variable resistors is equal to $$\frac{ADC1 \times R_{REF}}{ADC2},$$

where ADC1 is the first voltage level, ADC2 is the second measured voltage level corresponded to the variable resistor, and $R_{REF}$ is resistance of the reference resistor.

16. The method of claim 14, wherein the resistances of the M−1 variable resistors at the first coordinate are selected from a lookup table according to the first voltage level and the M−1 second measured voltage levels.

17. The method of claim 14 further comprising:
determining strength of a force applied to the at least one touch point according to resistance of a variable resistor at the at least one touch point.

18. The method of claim 17, wherein the strength of the force is obtained according to a function of $$\left(\frac{ADC2}{ADC1 \times R_{REF}}\right),$$

where ADC2 is the second measured voltage level corresponded to the second coordinate, ADC1 is the first voltage level, and $R_{REF}$ is resistance of the reference resistor.

19. The method of claim 17, wherein the strength of the force is determined by using an interpolation algorithm.

20. The method of claim 17, wherein the at least touch point is determined to being triggered if the strength of the force is greater than a predetermined threshold.

21. The method of claim 17, wherein determining the strength of the force applied to the at least one touch point according to the first voltage level and the second measured voltage level corresponded to the second coordinate comprises:
   selecting a lookup table from a plurality of lookup tables according to the first coordinate and the second coordinate; and
   selecting a corresponding value from the selected lookup table as the strength of the force according to resistance of a variable resistors at the at least one touch point.

22. The method of claim 17, wherein determining the strength of the force applied to the at least one touch point according to the first voltage level and the second measured voltage level corresponded to the second coordinate comprises:
   selecting a corresponding value from a lookup table as the strength of the force according to the resistance of a variable resistors at the at least one touch point.

23. The method of claim 17 further comprising:
   outputting a control signal according to the strength of the force;
   wherein if the strength of the force is greater than or equal to a first predetermined value, the control signal is a first control signal;
   wherein if the strength of the force is less than the first predetermined value and not less than a second predetermined value, the control signal is a second control signal; and
   wherein the second predetermined value is less than the first predetermined value, and the first control signal is different from the second control signal.

24. The method of claim 16 further comprising:
   outputting information of the strength of the force.

25. The method of claim 1, wherein steps of the method are repeated at regular intervals.

26. The method of claim 1, wherein the first voltage is constantly applied to the first end of the reference resistor and the second voltage is constantly applied to first ends of the M−1 variable resistors until the at least one touch point is determined to being triggered.

27. The method of claim 1, wherein measuring the variations of the first voltage level of the each second trace comprises:
   measuring the variations of the first voltage level of the each second trace by a general-purpose input/output (GPIO) circuit.

28. The method of claim 1, wherein a ratio of resistance of the reference resistor to activation force resistance of each of M−1 variable resistors falls in a range of 0.2 to 5.

* * * * *